(12) United States Patent
Wu

(10) Patent No.: US 10,026,916 B2
(45) Date of Patent: Jul. 17, 2018

(54) ORGANIC ELECTROLUMINESCENT APPARATUS FORMING A MICROCAVITY

(71) Applicant: BOE TECHNOLOGY GROUP CO., LTD., Beijing (CN)

(72) Inventor: Changyen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/543,548

(22) PCT Filed: Jun. 7, 2016

(86) PCT No.: PCT/CN2016/085092
§ 371 (c)(1),
(2) Date: Jul. 13, 2017

(87) PCT Pub. No.: WO2017/024881
PCT Pub. Date: Feb. 16, 2017

(65) Prior Publication Data
US 2018/0040842 A1 Feb. 8, 2018

(30) Foreign Application Priority Data
Aug. 12, 2015 (CN) .......................... 2015 1 0494604

(51) Int. Cl.
*H01L 51/52* (2006.01)
*H01L 51/50* (2006.01)
(Continued)

(52) U.S. Cl.
CPC ...... *H01L 51/504* (2013.01); *H01L 21/02008* (2013.01); *H01L 27/15* (2013.01);
(Continued)

(58) Field of Classification Search
CPC .............. H01L 51/5265; H01L 51/504; H01L 51/5218; H01L 51/5234; H01L 51/5278;
(Continued)

(56) References Cited

U.S. PATENT DOCUMENTS 7,142,179 B2 * 11/2006 Miller .................. G09G 3/3233
345/76
7,250,722 B2 * 7/2007 Cok ..................... H01L 27/3209
313/504

(Continued)

FOREIGN PATENT DOCUMENTS

CN          1913730 A       2/2007
CN        101132020 A       2/2008
(Continued)

OTHER PUBLICATIONS

International Search Report & Written Opinion dated Sep. 8, 2016, regarding PCT/CN2016/085092.
(Continued)

*Primary Examiner* — Ida M Soward
(74) *Attorney, Agent, or Firm* — Intellectual Valley Law, P.C.

(57) ABSTRACT

The present application discloses a tandem organic electroluminescent apparatus including a reflective electrode; a first light emitting unit on the reflective electrode; a semi-transparent connecting layer on a side of the first light emitting unit distal to the reflective electrode; at least one second light emitting unit on a side of the semi-transparent connecting layer distal to the first light emitting unit; and a transparent electrode on a side of the at least one second light emitting unit distal to the semi-transparent connecting layer. The semi-transparent connecting layer and the reflective electrode form a microcavity.

20 Claims, 4 Drawing Sheets

(51) Int. Cl.
*H01L 27/15* (2006.01)
*H01L 27/14* (2006.01)
*H01L 33/40* (2010.01)
*H01L 33/42* (2010.01)
*H01L 21/02* (2006.01)
*H01L 27/146* (2006.01)
*G02F 1/1335* (2006.01)

(52) U.S. Cl.
CPC .... *H01L 51/5218* (2013.01); *G02F 1/133553* (2013.01); *H01L 27/14629* (2013.01); *H01L 33/405* (2013.01); *H01L 33/42* (2013.01); *H01L 51/5234* (2013.01); *H01L 51/5265* (2013.01); *H01L 51/5271* (2013.01); *H01L 51/5278* (2013.01)

(58) Field of Classification Search
CPC ................. H01L 51/5271; H01L 27/15; H01L 27/14629; H01L 33/405; H01L 33/42; G02F 1/133553
See application file for complete search history.

(56) References Cited

U.S. PATENT DOCUMENTS

| | | | | |
|---|---|---|---|---|
| 7,494,722 | B2* | 2/2009 | Liao | H01L 51/5278 257/E51.022 |
| 7,800,295 | B2 | 9/2010 | D'Andrade et al. | |
| 7,915,701 | B2* | 3/2011 | Forrest | B82Y 10/00 136/263 |
| 8,057,916 | B2* | 11/2011 | Hatwar | H01L 51/5278 313/504 |
| 8,227,978 | B2* | 7/2012 | Lee | H01L 51/5265 313/506 |
| 8,872,170 | B2* | 10/2014 | Su | H01L 51/5012 257/40 |
| 8,889,858 | B2* | 11/2014 | Inoue | H01L 51/0085 544/225 |
| 9,412,793 | B2* | 8/2016 | Seo | H01L 27/3213 |
| 9,735,206 | B2* | 8/2017 | Heo | H01L 27/3209 |
| 2007/0035234 | A1 | 2/2007 | Lee | |
| 2008/0048560 | A1 | 2/2008 | Sung et al. | |
| 2009/0001885 | A1* | 1/2009 | Spindler | H01L 51/0079 313/506 |
| 2011/0114981 | A1 | 5/2011 | Higaki et al. | |
| 2011/0187259 | A1* | 8/2011 | Fukuda | H01K 1/26 313/114 |
| 2012/0153336 | A1* | 6/2012 | Dussert-Vidalet | H01L 51/52 257/98 |
| 2018/0019445 | A1* | 1/2018 | Suzuki | H01L 51/5012 |

FOREIGN PATENT DOCUMENTS

| | | |
|---|---|---|
| CN | 102077386 A | 5/2011 |
| JP | 2011018451 A | 1/2011 |
| KR | 1020070019496 A | 2/2007 |
| KR | 1020140027349 A | 9/2015 |

OTHER PUBLICATIONS

Chinese Search Report in the Chinese Patent Application No. 201510494604.0, dated Jan. 21, 2016; English translation attached.
First Office Action in the Chinese Patent Application No. 201510494604.0, dated Apr. 20, 2016; English translation attached.
Second Office Action in the Chinese Patent Application No. 201510494604.0, dated Jul. 15, 2016; English translation attached.
Third Office Action in the Chinese Patent Application No. 201510494604.0, dated Oct. 8, 2016; English translation attached.
Fourth Office Action in the Chinese Patent Application No. 201510494604.0, dated Aug. 24, 2017; English translation attached.
Decision of Rejection in the Chinese Patent Application No. 201510494604.0, dated Mar. 3, 2017; English translation attached.
Korean First Office Action in the Korean Patent Application No. 1020177022812, dated Apr. 30, 2018; English translation attached.

\* cited by examiner

ORGANIC ELECTROLUMINESCENT APPARATUS FORMING A MICROCAVITY

CROSS-REFERENCE TO RELATED APPLICATION

This application is a national stage application under 35 U.S.C. § 371 of International Application No. PCT/CN2016/085092 filed Jun. 7, 2016, which claims priority to Chinese Patent Application No. 201510494604.0, filed Aug. 12, 2015, the contents of which are incorporated by reference in the entirety.

TECHNICAL FIELD

The present invention relates to display technology, more particularly, to an organic electroluminescent apparatus and a fabrication method thereof.

BACKGROUND

Tandem organic electroluminescent apparatuses are fabricated by stacking several individual organic light emitting units vertically. Each organic light emitting unit includes an organic light emitting layer and organic layers on both sides of the organic light emitting layer. Emission efficiency of the tandem organic electroluminescent apparatus increases in proportion to the number of vertically stacked organic light emitting units. As compared to the conventional organic electroluminescent apparatuses, the tandem organic electroluminescent apparatuses have an improved current efficiency, an increased device lifetime, and an enhanced luminous intensity.

SUMMARY

In one aspect, the present invention provides a tandem organic electroluminescent apparatus comprising a reflective electrode; a first light emitting unit on the reflective electrode; a semi-transparent connecting layer on a side of the first light emitting unit distal to the reflective electrode; at least one second light emitting unit on a side of the semi-transparent connecting layer distal to the first light emitting unit; and a transparent electrode on a side of the at least one second light emitting unit distal to the semi-transparent connecting layer; wherein the semi-transparent connecting layer and the reflective electrode form a microcavity.

Optionally, the semi-transparent connecting layer and the reflective electrode are apart from each other by a distance of L±40 nm, L is calculated based on $2\Sigma nL + Q\lambda/2\pi = m\lambda$, n is the index of refraction of a first light emitting layer in the first light emitting unit, Q is the sum of phase shifts in radians at the reflective mirrors of the semi-transparent connecting layer and the reflective electrode, $\lambda$ is a peak wavelength of light to be emitted from the device, and m is a non-negative integer.

Optionally, the distance is defined by a thickness of the first light emitting unit.

Optionally, the first light emitting unit is a monochromatic light emitting unit.

Optionally, the first light emitting unit is a blue light emitting unit, and the second light emitting unit is a yellow light emitting unit.

Optionally, the semi-transparent connecting layer is made of one or a combination of silver, aluminum, magnesium, calcium, ytterbium, and lithium.

Optionally, the semi-transparent connecting layer has a thickness of more than 10 nm.

Optionally, the semi-transparent connecting layer has a thickness in the range of about 10 nm to about 30 nm.

Optionally, the yellow light emitting unit comprises a yellow light emitting layer, a first carrier transport layer on a side of the yellow light emitting layer proximal to the semi-transparent connecting layer, a first carrier injection layer on a side of the first carrier transport layer proximal to the semi-transparent connecting layer, a second carrier transport layer on a side of the yellow light emitting layer distal to the semi-transparent connecting layer, and a second carrier injection layer on a side of the second carrier transport layer distal to the semi-transparent connecting layer; a sum of thicknesses of the first carrier transport layer and the first carrier injection layer is in the range of about 20 nm to about 35 nm.

Optionally, the sum of thicknesses is about 25 nm.

Optionally, the blue light emitting unit has a thickness in the range of about 60 nm to about 90 nm.

Optionally, the blue light emitting unit comprises a blue light emitting layer, a third carrier transport layer on a side of the blue light emitting layer proximal to the semi-transparent connecting layer, a third carrier injection layer on a side of the third carrier transport layer proximal to the semi-transparent connecting layer, a fourth carrier transport layer on a side of the blue light emitting layer distal to the semi-transparent connecting layer, and a fourth carrier injection layer on a side of the fourth carrier transport layer distal to the semi-transparent connecting layer.

Optionally, the blue light emitting unit has a thickness of about 70 nm.

Optionally, the blue light emitting unit has a thickness in the range of about 165 nm to about 215 nm.

Optionally, the reflective electrode is made of one or a combination of silver and aluminum.

Optionally, the reflective electrode has a thickness in the range of about 80 nm to about 300 nm.

Optionally, the reflective electrode has a thickness of about 200 nm.

In another aspect, the present invention provides a method of fabricating a tandem organic electroluminescent apparatus, comprising forming a reflective electrode on a base substrate; forming a first light emitting unit on the reflective electrode; forming a semi-transparent connecting layer on a side of the first light emitting unit distal to the reflective electrode; forming at least one second light emitting unit on a side of the semi-transparent connecting layer distal to the first light emitting unit; and forming a transparent electrode on a side of the at least one second light emitting unit distal to the semi-transparent connecting layer; wherein the semi-transparent connecting layer and the reflective electrode form a microcavity.

Optionally, the first light emitting unit is a blue light emitting unit, and the second light emitting unit is a yellow light emitting unit.

In another aspect, the present invention provides a display apparatus comprising a tandem organic electroluminescent apparatus described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
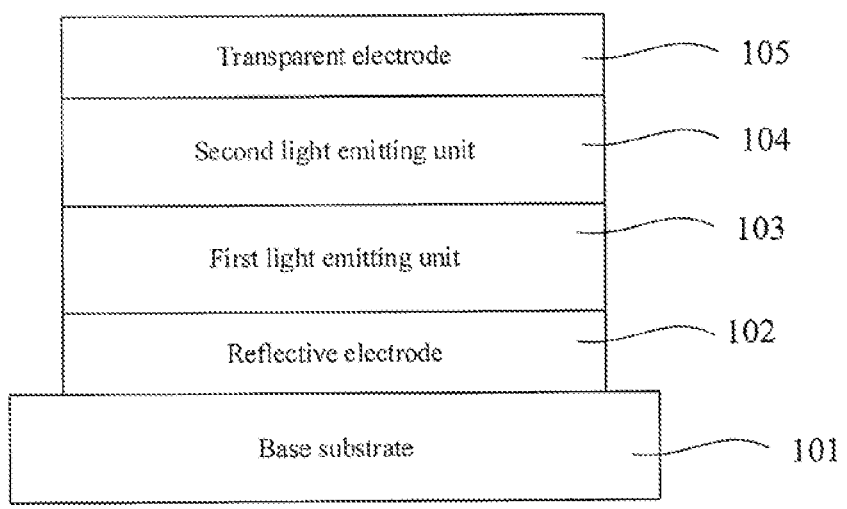
FIG. 1 is a diagram illustrating the structure of a conventional organic electroluminescent apparatus.

FIG. 1 is a diagram illustrating the structure of a conventional organic electroluminescent apparatus. Referring to FIG. 1, the conventional organic electroluminescent apparatus includes a first light emitting unit and a second light emitting unit. The first and the second light emitting units may emit light of different colors. A compound light of light from the first and the second light emitting units has a desired color of light for the organic electroluminescent apparatus. For instance, a white organic electroluminescent apparatus may have a blue light emitting unit and a yellow light emitting unit. A white light is achieved by mixing the blue light and the yellow light from two light emitting units. To increase color temperature of a white light emitted in the conventional organic electroluminescent apparatus, a plurality of additional light emitting units of certain colors may be added in tandem to increase emission intensity. As a result, the apparatus thickness and driving voltage for operating the light emitting apparatus significantly increase.

The present disclosure provides a superior tandem organic electroluminescent apparatus that provides true color, higher emission intensity, and greatly reduced color shift at large viewing angles, as compared to conventional tandem organic electroluminescent apparatus. In some embodiments, the organic electroluminescent apparatus is a white organic electroluminescent apparatus that provides true white color temperature, higher emission intensity, and greatly reduced color shift at large viewing angles, as compared to conventional white organic electroluminescent apparatus. In some embodiments, the organic electroluminescent apparatus includes a reflective electrode; a first light emitting unit on the reflective electrode; a semi-transparent connecting layer on a side of the first light emitting unit distal to the reflective electrode; and at least one second light emitting unit on a side of the semi-transparent connecting layer distal to the first light emitting unit. Optionally, the semi-transparent connecting layer abuts the first light emitting unit on one side and abuts the second light emitting unit on the other side. Optionally, the organic electroluminescent apparatus further includes a transparent electrode on a side of the at least one second light emitting unit distal to the semi-transparent connecting layer. Optionally, the semi-transparent connecting layer and the reflective electrode are apart from each other by a distance for resonance emission of a peak emission wavelength of the first light emitting unit, i.e., the semi-transparent connecting layer and the reflective electrode form a microcavity.

The first light emitting unit may emit first light of a first single color. The second light emitting unit may emit second light of a second single color. The tandem organic electroluminescent apparatus emits a compound light including the first light and the second light. In some embodiments, the first light has a color different from that of the second light (e.g., a yellow light and a blue light). Optionally, the first light emitting unit emits a blue light, and the second light emitting unit emits a yellow light, the tandem organic electroluminescent apparatus emits a white light.

Figure 2:
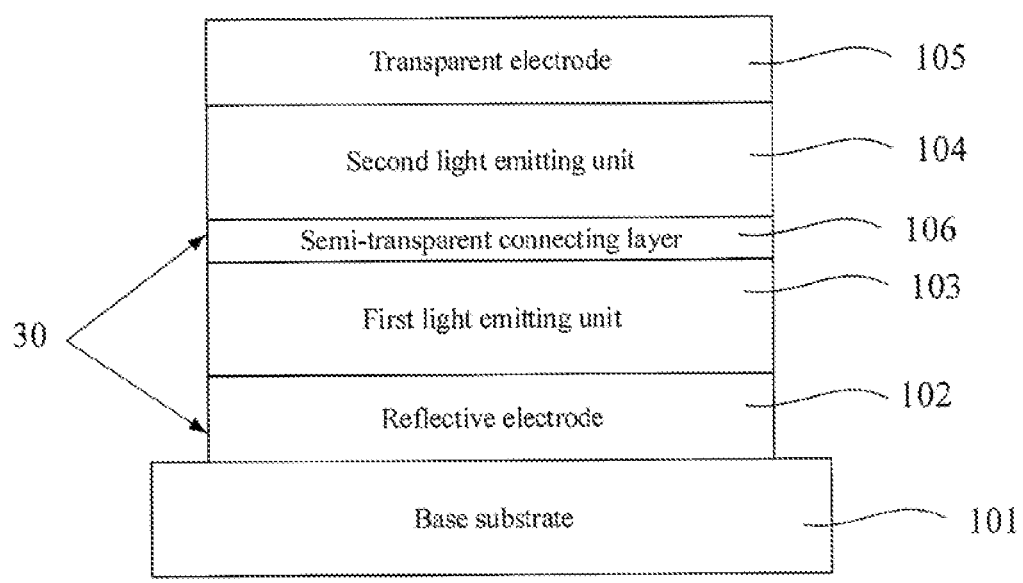
FIG. 2 is a diagram illustrating the structure of an organic electroluminescent apparatus in some embodiments.

FIG. 2 is a diagram illustrating the structure of an organic electroluminescent apparatus in some embodiments. Referring to FIG. 2, the organic electroluminescent apparatus in the embodiment includes a base substrate 101, a reflective electrode 102 on the base substrate 101, a first light emitting unit 103 on a side of the reflective electrode 102 distal to the base substrate 101, a semi-transparent connecting layer 106 on a side of the first light emitting unit 103 distal to the reflective electrode 102, a second light emitting unit 104 on a side of the semi-transparent connecting layer 106 distal to the first light emitting unit 103, and a transparent electrode 105 on a side of the second light emitting unit 104 distal to the semi-transparent connecting layer 106. The first light emitting unit 103 and the second light emitting unit 104 emit light of different colors. Optionally, the organic electroluminescent apparatus includes a plurality of vertically stacking second light emitting units 104 on a side of the semi-transparent connecting layer 106 distal to the first light emitting unit 103. Optionally, the organic electroluminescent apparatus includes only a single light emitting units 104 on a side of the semi-transparent connecting layer 106 distal to the first light emitting unit 103. Optionally, the reflective electrode 102 is a cathode, and the transparent electrode 105 is an anode. Optionally, the reflective electrode 102 is an anode, and the transparent electrode 105 is a cathode.

Optionally, a microcavity 30 is formed between the semi-transparent connecting layer 106 and the reflective electrode 102, due in part to strong light reflection capability of the reflective electrode 102. The first light emitting layer is in the microcavity 30. The microcavity structure modifies the light emitting characteristic of light emitted from the first light emitting layer. For instance, the emission of light of a wavelength corresponding to a resonance wavelength of the microcavity may be enhanced, and light of other wavelengths may be suppressed. The enhancement of the light of the specific wavelength and the suppression of light emission may be determined based on a distance between the semi-transparent connecting layer 106 and the reflective electrode 102. Optionally, the distance between the semi-transparent connecting layer 106 and the reflective electrode 102 may be controlled by adjusting a thickness of the first light emitting unit 103. Optionally, the distance between the semi-transparent connecting layer 106 and the reflective electrode 102 may be controlled by other suitable methods (e.g., by having an additional layer between the semi-transparent connecting layer 106 and the reflective electrode 102).

As shown in FIG. 2, the semi-transparent connecting layer 106 and the reflective electrode 102 function as two reflective mirrors of the microcavity 30. The light path between the semi-transparent connecting layer 106 and the reflective electrode 102 may be set at a distance such that light emitted from the first light emitting unit 103 reflects back-and-forth between the semi-transparent connecting layer 106 and the reflective electrode 102 prior to exiting the microcavity 30. A more intense light in a narrower spectrum from the first light emitting unit 103 is obtained due to the microcavity effect, i.e., emission intensity of light emitted from the first light emitting unit 103 is enhanced at a certain wavelength by the microcavity 30, without affecting emission intensity of light emitted from the second light emitting unit 104. Accordingly, the emission intensity of light of the first color can be enhanced without the need of increasing apparatus thickness or driving voltage.

In some embodiments, the semi-transparent connecting layer 106 and the transparent electrode 105 form two reflective mirrors of a second (albeit weaker) microcavity. The light path between the semi-transparent connecting layer 106 and the transparent electrode 105 may be set at a distance such that light emitted from the second light emitting unit 104 reflects back-and-forth between the semi-transparent connecting layer 106 and the transparent electrode 105 prior to exiting the second microcavity. As such the organic electroluminescent apparatus includes a strong microcavity structure (microcavity 30) and a weaker microcavity structure (the second microcavity). A synergistic effect is obtained by combining the strong microcavity structure and the second microcavity structure in a same organic electroluminescent apparatus, achieving an emitted white light having an increased color temperature without the need of increasing the apparatus thickness or driving voltage.

In some embodiments, the semi-transparent connecting layer 106 and the reflective electrode 102 form a microcavity 30. Optionally, the semi-transparent connecting layer 106 and the reflective electrode 102 are apart from each other by a distance sufficient for satisfying a microcavity condition. Optionally, the semi-transparent connecting layer 106 and the reflective electrode 102 are apart from each other by a distance corresponding to a depth of the microcavity, the depth of the microcavity configured for resonance emission of a peak emission wavelength of the first light emitting unit 103 (i.e., a resonance wavelength). For example, when the first light emitting unit 103 is a blue light emitting unit, the depth of the microcavity 30 is configured for resonance emission of a blue light wavelength. Optionally, the peak emission wavelength of the blue light emitting unit is a wavelength in the range of 430 nm to 480 nm. Optionally, the peak emission wavelength of the blue light emitting unit is a wavelength in the range of 430 nm to 495 nm. Optionally, the peak emission wavelength of the blue light emitting unit is a wavelength in the range of 450 run to 495 nm. Optionally, the peak emission wavelength of the blue light emitting unit is a wavelength in the range of 450 nm to 480 nm. Optionally, the peak emission wavelength of the blue light emitting unit is a wavelength in the range of 470 nm to 480 nm. Optionally, the peak emission wavelength of the blue light emitting unit is about 475 nm.

Optionally, the depth of the microcavity L approximately satisfies the following equation: $2\Sigma nL + Q\lambda/2\pi = m\lambda$; wherein n is the index of refraction of a first light emitting layer in the first light emitting unit, Q is the sum of phase shifts in radians at the reflective mirrors of the semi-transparent connecting layer and the reflective electrode, λ is a peak wavelength of light to be emitted from the device, and m is a non-negative integer. Optionally, m=1. Optionally, m=2.

Optionally, the distance between the semi-transparent connecting layer 106 and the reflective electrode 102 is a distance L calculated based on the above equation. Optionally, the distance between the semi-transparent connecting layer 106 and the reflective electrode 102 is L±10 nm. Optionally, the distance between the semi-transparent connecting layer 106 and the reflective electrode 102 is L±20 nm. Optionally, the distance between the semi-transparent connecting layer 106 and the reflective electrode 102 is L±30 nm. Optionally, the distance between the semi-transparent connecting layer 106 and the reflective electrode 102 is L±40 nm. Optionally, the distance between the semi-transparent connecting layer 106 and the reflective electrode 102 is in the range of about 60 nm to about 90 nm. Optionally, the distance between the semi-transparent connecting layer 106 and the reflective electrode 102 is about 70 nm. Optionally, the distance between the semi-transparent connecting layer 106 and the reflective electrode 102 is in the range of about 165 nm to about 215 nm.

Figure 4:
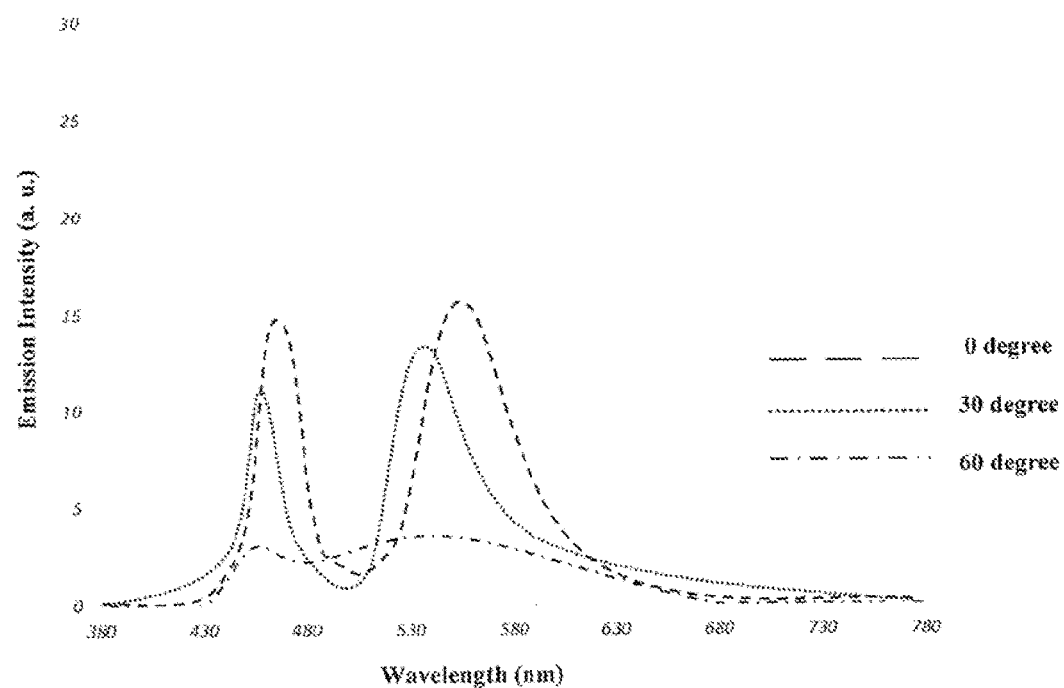
FIG. 4 shows the emission intensity spectra of a conventional organic electroluminescent apparatus at various viewing angles.

In some embodiments, the first light emitting unit 103 is a blue light emitting unit, and the second light emitting unit 104 is a yellow light emitting unit. FIG. 4 shows the emission intensity spectra of a conventional organic electroluminescent apparatus (e.g., a conventional organic electroluminescent apparatus of FIG. 1) at various viewing angles. The weaker emission peak in FIG. 4 corresponds to a blue light having a wavelength in the range of 430 nm to 480 nm, and the stronger emission peak corresponds to a yellow light having a wavelength in the range of 580 nm to 680 nm. Thus, in the compound light from the conventional organic electroluminescent apparatus, the emission intensity of the blue light is lower than the emission intensity of the yellow light. The resulting compound light is a "warm white" light having an ultra-low color temperature, resulting in less than optimal display quality. Moreover, the conventional organic electroluminescent apparatus produces a significant color shift at large viewing angles, leading to unpleasant viewing experience.

Figure 3:
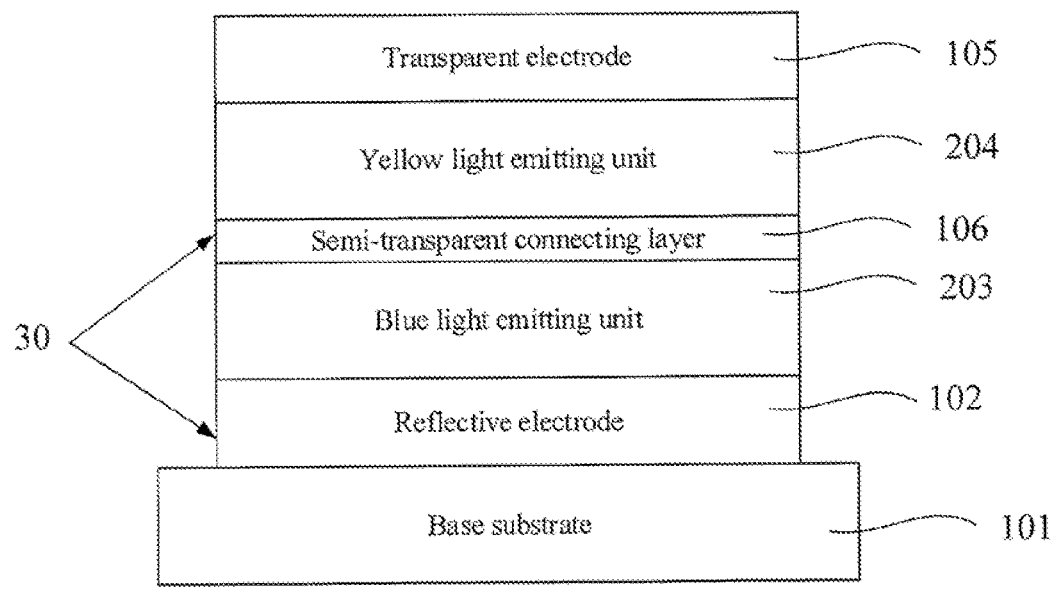
FIG. 3 is a diagram illustrating the structure of a tandem white organic electroluminescent apparatus in some embodiments.

The present disclosure provides a very thin and low power consuming organic electroluminescent apparatus that emits a white light having an increased color temperature. FIG. 3 is a diagram illustrating the structure of a tandem white organic electroluminescent apparatus in some embodiments. Referring to FIG. 3, the first light emitting unit is a blue light emitting unit 203, and the second light emitting unit is a yellow light emitting unit 204. Various alternative embodiments may be practiced to make and use an organic electroluminescent apparatus having various combinations of light emitting units of different colors, taking into consideration the lifetime and light emission efficiency of various light emitting materials. For example, the organic electroluminescent apparatus may include a strong microcavity structure having a blue fluorescent emitter and a weaker microcavity structure having a yellow phosphorescent emitter.

In some embodiments, the second light emitting unit (e.g., the yellow light emitting unit) includes a second light emitting layer (e.g., a yellow light emitting layer), a first carrier transport layer on a side of the second light emitting layer proximal to the semi-transparent connecting layer, a first carrier injection layer on a side of the first carrier transport layer proximal to the semi-transparent connecting layer, a second carrier transport layer on a side of the second light emitting layer distal to the semi-transparent connecting layer, and a second carrier injection layer on a side of the second carrier transport layer distal to the semi-transparent connecting layer.

In some embodiments, the first light emitting unit (e.g., the blue light emitting unit) includes a first light emitting layer (e.g., a blue light emitting layer), a third carrier transport layer on a side of the first light emitting layer proximal to the semi-transparent connecting layer, a third carrier injection layer on a side of the third carrier transport layer proximal to the semi-transparent connecting layer, a fourth carrier transport layer on a side of the first light emitting layer distal to the semi-transparent connecting layer, and a fourth carrier injection layer on a side of the fourth carrier transport layer distal to the semi-transparent connecting layer.

Table 1 shows the dimensions and materials used for fabricating a tandem organic electroluminescent apparatus having a blue light emitting unit 203 and a yellow light emitting unit 204 in some embodiments.

TABLE 1

Dimensions and materials used for fabricating a tandem organic electroluminescent apparatus in some embodiments

| | Layers | Material | Thickness (nm) |
|---|---|---|---|
| | Transparent electrode | Transparent conductive oxide | 135 |
| Yellow light emitting unit | Organic layer | | 130 |
| | Yellow light emitting layer | | 30 |
| | Organic layer | | 25 |
| | Semi-transparent connecting layer | Silver | 20 |
| Blue light emitting unit | Organic layer | | 15 |
| | Blue light emitting layer | | 25 |
| | Organic layer | | 30 |
| | Reflective electrode | Silver | 200 |
| | Base substrate | Indium tin oxide/glass | 500000 |

Figure 7:
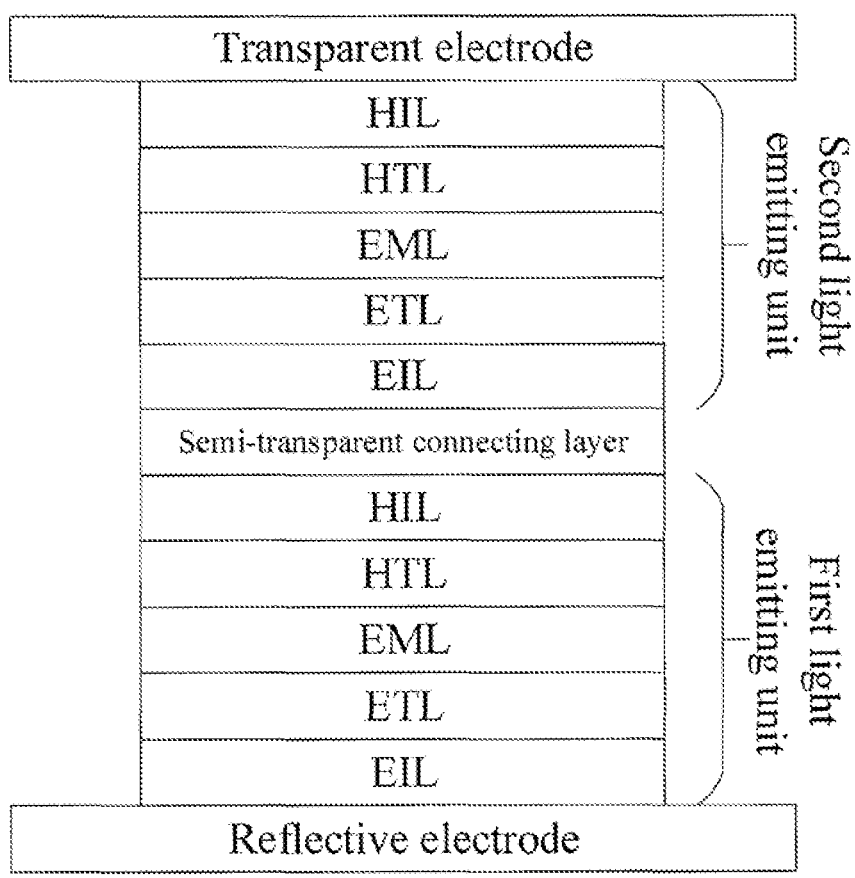
FIG. 7 is a diagram illustrating the structure of an organic electroluminescent apparatus in some embodiments.

In some embodiments, the organic layer includes more than one organic functional layers. For examples, the organic layer may include a carrier transport layer and a carrier injection layer. The carrier transport layer is between the light emitting layer and the carrier injection layer (e.g., on a side of the carrier injection layer proximal to the light emitting layer). FIG. 7 is a diagram illustrating the structure of an organic electroluminescent apparatus in some embodiments. Referring to FIG. 7, the organic electroluminescent apparatus in the embodiment include a first light emitting unit, a second light emitting unit, and a semi-transparent connecting layer between the first light emitting unit and the second light emitting unit. As shown in FIG. 7, the first light emitting unit includes a first light emitting layer (EML), a hole transport layer (HTL) on a side of the first light emitting layer proximal to the semi-transparent connecting layer, a hole injection layer (HIL) on a side of the hole transport layer proximal to the semi-transparent connecting layer, an electron transport layer (ETL) on a side of the first light emitting layer distal to the semi-transparent connecting layer, and an electron injection layer (EIL) on a side of the electron transport layer distal to the semi-transparent connecting layer. The second light emitting unit includes a second light emitting layer (EML), a hole transport layer (HTL) on a side of the second light emitting layer distal to the semi-transparent connecting layer, a hole injection layer (HIL) on a side of the hole transport layer distal to the semi-transparent connecting layer, an electron transport layer (ETL) on a side of the second light emitting layer proximal to the semi-transparent connecting layer, and an electron injection layer (EIL) on a side of the electron transport layer proximal to the semi-transparent connecting layer.

Various appropriate materials may be used for making the organic layers and light emitting layers of the tandem organic electroluminescent apparatus. Examples of blue light emitting materials include, but are not limited to, complexes of Ir having phenylpyridine or phenylimidazole ligands, diarylanthracenes, diaminochrysenes, diaminopyrenes, and polyfluorene polymers. Examples of blue light emitting materials include, but are not limited to, complexes of Ir having phenylquinoline or phenylisoquinoline ligands, periflanthenes, fluoranthenes, and perylenes. Optionally, the organic layer includes one or more of a hole transport layer, a hole injection layer, an electron transport layer, and an electron injection layer. Examples of hole injection materials include, but are not limited to, phthalocyanine compounds, such as copper phthalocyanine (CuPc); star-burst type amine derivatives, such as 4,4',4"-tris(N-carbazolyl)triphenylamine (TCTA) and 4,4',4"-tris(3-methylphcnylphcnylamino) triphenylamine (m-MTDATA); and soluble polymers, such as polyaniline/dodecylbenzensulfonic acid (PaniDBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate) (PANI/PSS). Examples of hole transport materials include, but are not limited to, N-phenylcarbazole, polyvinyl carbazole, 1,3, 5-tricarbazolylbenzene, 4,4'-biscarbazolylbiphenyl, m-bis-carbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-diphenyl-N,N'-bis(1-naphthyl)-(1,1-biphenyl)-4,4'-diamine (NPB), N,N'-bis(3-methylphenyl)-N,N'-diphenyl-[1,1-biphenyl]-4,4'-diamine (TPD), poly(9,9-dioctylfluorene-co-N-(4-butylphenyl)diphenylamine (TFB), or poly(9,9-dioctyltfluorene-co-bis-(4-butylphenyl-bis-N,N-phenyl-1,4-phenylenediamine (PFB). Examples of electron transport materials include, but are not limited to, an oxazole-based compound, an isoxazole-based compound, a triazole-based compound, an isothiazole-based compound, an oxadiazole-based compound, a thiadiazole-based compound, a perylene-based compound, an aluminum complex, for example, Alq3, Bis(2-methyl-8-quinolinolato-N1,O8)-(1,1'-Biphenyl-4-olato)aluminum III ("Balq"), bis(2-methyl-8-quinolinato)triphenylsilanolate aluminum (III)("Salq"), tris (4-methyl-8-quinolinolato)aluminum(III)("Almq3"; a gallium complex, for example, tris(2-methyl-8-quinolinolato) (pivalato-O) gallium(III) ("Gaq' 2Opiv"), tris(2-methyl-8-quinolinolato)(acetato-O) gallium(III) ("Gaq' 2OAc"), tris(2-methyl-8quinolinolato)gallium(III) ("Gaq' 2"). Examples of electron injection materials include, but are not limited to, LiF, NaCl, CsF, Li2O, BaO, or CsCO3 with 2,9-dimethyl-1,10-phenanthroline.

In some embodiments, the reflective electrode is an anode. Optionally, the first light emitting unit 103 includes a first light emitting layer, a first hole transport layer on a side of the first light emitting layer proximal to the anode, and a first electron transport layer on a side of the first light emitting layer distal to the anode. Optionally, the first light emitting unit 103 further includes a first hole injection layer between the first hole transport layer and the anode. Optionally, the first light emitting unit 103 further includes a first electrode injection layer between the first electron transport layer and the semi-transparent connecting layer. Optionally, the second light emitting unit 104 includes a second light emitting layer, a second hole transport layer on a side of the first light emitting layer proximal to the anode, and a second electron transport layer on a side of the second light emitting layer distal to the anode. Optionally, the second light emitting unit 104 further includes a second hole injection layer between the second hole transport layer and the semi-transparent connecting layer. Optionally, the second light emitting unit 104 further includes a second electrode injection layer between the second electron transport layer and the cathode. Optionally, the cathode is a transparent electrode.

In some embodiments, the reflective electrode is a cathode. Optionally, the first light emitting unit 103 includes a first light emitting layer, a first electron transport layer on a side of the first light emitting layer proximal to the cathode, and a first hole transport layer on a side of the first light emitting layer distal to the cathode. Optionally, the first light emitting unit 103 further includes a first electron injection layer between the first electron transport layer and the cathode. Optionally, the first light emitting unit 103 further includes a first hole injection layer between the first hole transport layer and the semi-transparent connecting layer. Optionally, the second light emitting unit 104 includes a second light emitting layer, a second electron transport layer on a side of the first light emitting layer proximal to the cathode, and a second hole transport layer on a side of the second light emitting layer distal to the cathode. Optionally, the second light emitting unit 104 further includes a second electron injection layer between the second electron transport layer and the semi-transparent connecting layer. Optionally, the second light emitting unit 104 further includes a second hole injection layer between the second hole transport layer and the anode. Optionally, the anode is a transparent electrode.

As shown in FIG. 3, the semi-transparent connecting layer 106 and the reflective electrode 102 function as two reflective mirrors of the microcavity 30. The light path between the semi-transparent connecting layer 106 and the reflective electrode 102 may be set at a distance such that the blue light emitted from the blue light emitting unit 203 reflects repeatedly between the semi-transparent connecting layer 106 and the reflective electrode 102 prior to exiting the microcavity 30. A more intense blue light in a narrower spectrum from the blue light emitting unit 203 is obtained due to the microcavity effect, i.e., emission intensity of the blue light emitted from the blue light emitting unit 203 is enhanced at a certain wavelength by the microcavity 30, without affecting emission intensity of light emitted from the yellow light emitting unit 204. As a result, the color temperature of the white light emitted from the tandem organic electroluminescent apparatus can be increased, and the emission efficiency of the tandem organic electroluminescent apparatus enhanced.

Figure 5:
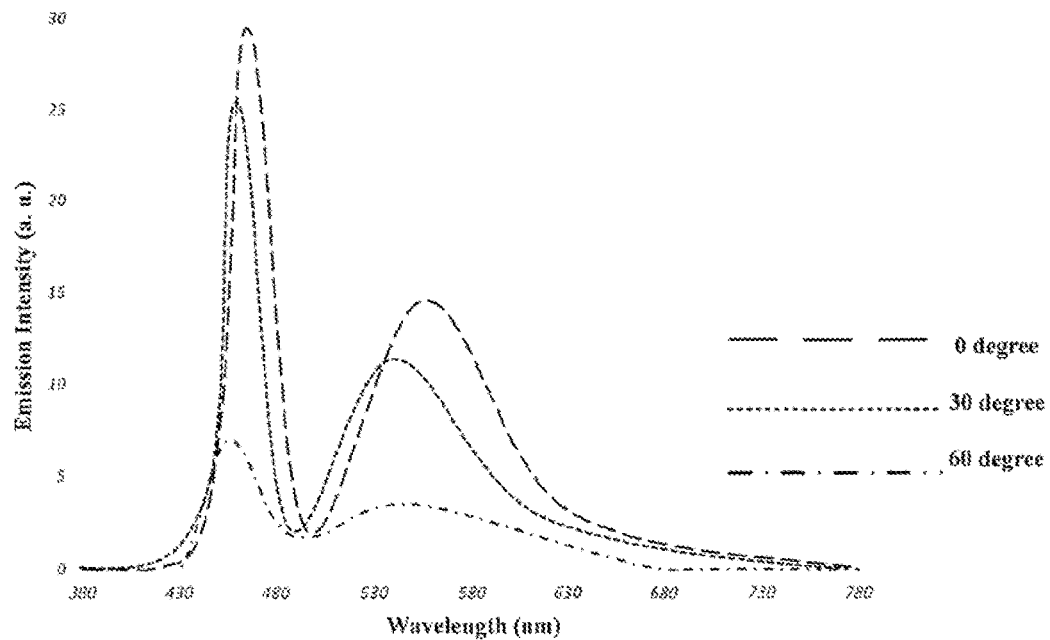
FIG. 5 shows the emission intensity spectra of a tandem white organic electroluminescent apparatus in some embodiments at various viewing angles.

FIG. 5 shows the emission intensity spectra of a tandem white organic electroluminescent apparatus in some embodiments at various viewing angles. The weaker emission peak in FIG. 5 corresponds to a blue light having a wavelength in the range of 430 nm to 480 nm, and the stronger emission peak corresponds to a yellow light having a wavelength in the range of 580 nm to 680 nm. The blue light emission intensity of the tandem white organic electroluminescent apparatus in FIG. 5 is nearly doubled as compared to that of a conventional organic electroluminescent apparatus in FIG. 4. Moreover, the white light emission intensity of the tandem white organic electroluminescent apparatus in FIG. 5 is nearly 30% higher as compared to that of a conventional organic electroluminescent apparatus in FIG. 4. For example, a tandem white organic electroluminescent apparatus in FIG. 5 has a white light emission intensity of 1561 a.u., while a conventional organic electroluminescent apparatus in FIG. 4 has a white light emission intensity of 1205 a.u.

The increased blue light emission intensity results in a higher color temperature of the compound white light produced in the tandem white organic electroluminescent apparatus (Table 2). As a result, the color temperature of white light generated by the present tandem white organic electroluminescent apparatus is much closer to true white light ($CIE_{x,y}$=0.28, 0.29) as compared to a conventional organic electroluminescent apparatus. Moreover, the conventional organic electroluminescent apparatus produces a significant color shift at large viewing angles (Table 2). The color shift defect is eliminated or much reduced in the present tandem white organic electroluminescent apparatus (Table 2).

TABLE 2

Comparison of CIE values of a tandem white organic electroluminescent apparatus in some embodiments and a conventional organic electroluminescent apparatus

| | | CIEx | CIEy | CIEu' | CIEv' | ΔCIEu'v' |
|---|---|---|---|---|---|---|
| Tandem white organic electroluminescent apparatus in some embodiments of the present disclosure | 0 degree viewing angle | 0.274 | 0.314 | 0.177 | 0.454 | |
| | 30 degree viewing angle | 0.258 | 0.302 | 0.169 | 0.445 | |
| | 60 degree viewing angle | 0.267 | 0.299 | 0.176 | 0.445 | 0.01 |
| Conventional organic electroluminescent apparatus | 0 degree viewing angle | 0.323 | 0.396 | 0.182 | 0.501 | |
| | 30 degree viewing angle | 0.293 | 0.408 | 0.160 | 0.502 | |
| | 60 degree viewing angle | 0.290 | 0.402 | 0.160 | 0.499 | 0.02 |

Various appropriate materials may be used for making the semi-transparent connecting layer 106. Examples of the semi-transparent connecting layer materials include, but are not limited to, silver, aluminum, magnesium, calcium, ytterbium, lithium, gold, platinum, chromium, palladium, nickel, neodymium, iridium, calcium, and alloys or laminates thereof (e.g., a silver-magnesium alloy). Optionally, the semi-transparent connecting layer 106 has a thickness that allows a reflectance of about 5% or more and a transmittance of about 50%. Optionally, the semi-transparent connecting layer 106 has a thickness sufficient for reflecting light strongly within the microcavity. Optionally, the semi-transparent connecting layer 106 has a thickness of more than 10 nm. Optionally, the semi-transparent connecting layer 106 has a thickness in the range of about 10 nm to 30 nm.

Optionally, the semi-transparent connecting layer is made of silver, and has a thickness in the range of about 10 nm to 30 nm.

Optionally, the yellow light emitting layer proximal to the semi-transparent connecting layer emits a yellow light that generates a standing wave. Optionally, the yellow light emitting layer is positioned at a first antinode of the standing wave calculated from a surface of the semi-transparent connecting layer proximal to the yellow light emitting layer for achieving an enhanced emission efficiency. Optionally, the organic layer (e.g., an organic layer comprising an electron transport layer and an electron injection layer) between the yellow light emitting layer and the semi-transparent connecting layer has a thickness in the range of about 20 nm to about 30 nm. Optionally, the organic layer between the yellow light emitting layer and the semi-transparent connecting layer has a thickness of about 25 nm.

Optionally, the blue light emitting layer has a thickness in the range of about 60 nm to about 90 nm. Optionally, the blue light emitting layer has a thickness of about 70 nm. Optionally, the blue light emitting unit has a thickness in the range of about 165 nm to about 215 nm. Optionally, the thickness of the blue light emitting unit is a sum of those of a blue light emitting layer, two carrier transport layers on two sides of the blue light emitting layer, and two carrier injection layers on two sides of the blue light emitting layer.

Optionally, the reflective electrode is made of silver or aluminum. Optionally, the reflective electrode has a thickness in the range of about 80 nm to about 300 nm. Optionally, the reflective electrode has a thickness of about 200 nm.

In some embodiments, the tandem organic electroluminescent apparatus includes only one single first light emitting unit and only one single second light emitting unit for achieving a small thickness. Optionally, the tandem organic electroluminescent apparatus is a tandem white organic electroluminescent apparatus having only one single blue light emitting unit and only one single yellow light emitting unit.

Figure 6:
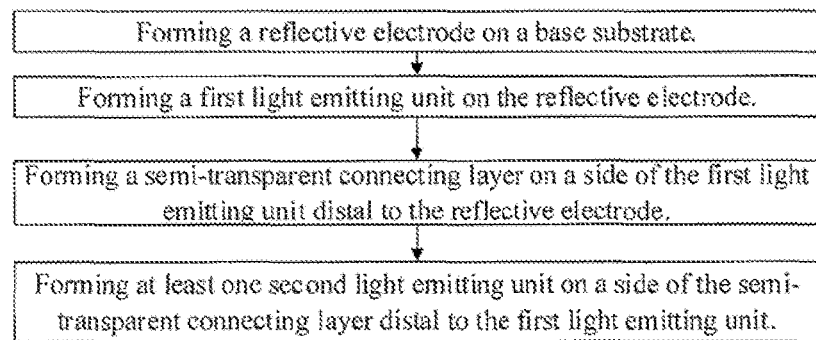
FIG. 6 is a flow chart illustrating a method of fabricating a tandem organic electroluminescent apparatus in some embodiments.

In another aspect, the present invention provides a method of fabricating a tandem organic electroluminescent apparatus. FIG. 6 is a flow chart illustrating a method of fabricating a tandem organic electroluminescent apparatus in some embodiments. Referring to FIG. 6, the method in the embodiment includes forming a reflective electrode on a base substrate; forming a first light emitting unit on the reflective electrode; forming a semi-transparent connecting layer on a side of the first light emitting unit distal to the reflective electrode; and forming at least one second light emitting unit on a side of the semi-transparent connecting layer distal to the first light emitting unit. The semi-transparent connecting layer and the reflective electrode are apart from each other by a distance for resonance emission of a peak emission wavelength of the first light emitting unit, i.e., the semi-transparent connecting layer and the reflective electrode form a microcavity for resonance emission of a resonance wavelength of the first light emitting unit.

Optionally, the depth of the microcavity L approximately satisfies the following equation: $2\Sigma nL + Q\lambda/2\pi = m\lambda$; wherein n is the index of refraction of a first light emitting layer in the first light emitting unit, Q is the sum of phase shifts in radians at the reflective mirrors of the semi-transparent connecting layer and the reflective electrode, $\lambda$ is a peak wavelength of light to be emitted from the device, and m is a non-negative integer. Optionally, m=1. Optionally, m=2.

Optionally, the distance between the semi-transparent connecting layer and the reflective electrode is a distance L calculated based on the above equation. Optionally, the distance between the semi-transparent connecting layer and the reflective electrode is L±10 nm. Optionally, the distance between the semi-transparent connecting layer and the reflective electrode is L±20 nm. Optionally, the distance between the semi-transparent connecting layer and the reflective electrode is L±30 nm. Optionally, the distance between the semi-transparent connecting layer and the reflective electrode is L±40 nm. Optionally, the distance between the semi-transparent connecting layer and the reflective electrode is in the range of about 60 nm to about 90 nm. Optionally, the distance between the semi-transparent connecting layer and the reflective electrode is about 70 nm. Optionally, the distance between the semi-transparent connecting layer and the reflective electrode is in the range of about 165 nm to about 215 nm.

In some embodiments, the second light emitting unit proximal to the semi-transparent connecting layer includes a second light emitting layer emitting a light which generates a standing wave, a second light emitting layer is formed at a first antinode of the standing wave calculated from a surface of the semi-transparent connecting layer proximal to the second light emitting layer.

Optionally, the method includes forming only a single second light emitting units on a side of the semi-transparent connecting layer distal to the first light emitting unit, i.e., the total number of the second light emitting unit in the tandem organic electroluminescent apparatus is one. Optionally, the method includes forming two second light emitting units on a side of the semi-transparent connecting layer distal to the first light emitting unit, i.e., the total number of the second light emitting unit in the tandem organic electroluminescent apparatus is two.

Optionally, the first light emitting unit is a blue light emitting unit, and the second light emitting unit is a yellow light emitting unit. Optionally, the tandem organic electroluminescent apparatus includes a single yellow light emitting unit. Optionally, the tandem organic electroluminescent apparatus includes two yellow light emitting unit.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second". etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A tandem organic electroluminescent apparatus, comprising:
   a reflective electrode;
   a first light emitting unit on the reflective electrode;
   a semi-transparent connecting layer on a side of the first light emitting unit distal to the reflective electrode;
   at least one second light emitting unit on a side of the semi-transparent connecting layer distal to the first light emitting unit; and
   a transparent electrode on a side of the at least one second light emitting unit distal to the semi-transparent connecting layer;
   wherein the semi-transparent connecting layer and the reflective electrode form a microcavity.

2. The tandem organic electroluminescent apparatus of claim 1, wherein the semi-transparent connecting layer and the reflective electrode are apart from each other by a distance of L±40 nm, L is calculated based on $2\Sigma nL+Q\lambda/2\pi=m\lambda$, is an index of refraction of a first light emitting layer in the first light emitting unit, Q is a sum of phase shifts in radians at reflective mirrors of the semi-transparent connecting layer and the reflective electrode, $\lambda$ is a peak wavelength of light to be emitted from the tandem organic electroluminescent apparatus, and m is a non-negative integer.

3. The tandem organic electroluminescent apparatus of claim 2, wherein the distance is defined by a thickness of the first light emitting unit.

4. The tandem organic electroluminescent apparatus of claim 1, wherein the first light emitting unit is a monochromatic light emitting unit.

5. The tandem organic electroluminescent apparatus of claim 1, wherein the first light emitting unit is a blue light emitting unit, and the second light emitting unit is a yellow light emitting unit.

6. The tandem organic electroluminescent apparatus of claim 5, wherein the semi-transparent connecting layer is made of one or a combination of silver, aluminum, magnesium, calcium, ytterbium, and lithium.

7. The tandem organic electroluminescent apparatus of claim 6, wherein the semi-transparent connecting layer has a thickness of more than 10 nm.

8. The tandem organic electroluminescent apparatus of claim 7, wherein the semi-transparent connecting layer has a thickness in a range of about 10 nm to about 30 nm.

9. The tandem organic electroluminescent apparatus of claim 8, wherein the yellow light emitting unit comprises a yellow light emitting layer, a first carrier transport layer on a side of the yellow light emitting layer proximal to the semi-transparent connecting layer, a first carrier injection layer on a side of the first carrier transport layer proximal to the semi-transparent connecting layer, a second carrier transport layer on a side of the yellow light emitting layer distal to the semi-transparent connecting layer, and a second carrier injection layer on a side of the second carrier transport layer distal to the semi-transparent connecting layer; wherein a sum of thicknesses of the first carrier transport layer and the first carrier injection layer is in a range of about 20 nm to about 35 nm.

10. The tandem organic electroluminescent apparatus of claim 9, wherein the sum of thicknesses is about 25 nm.

11. The tandem organic electroluminescent apparatus of claim 5, wherein the blue light emitting unit has a thickness in a range of about 60 nm to about 90 nm.

12. The tandem organic electroluminescent apparatus of claim 11, wherein the blue light emitting unit comprises a blue light emitting layer, a third carrier transport layer on a side of the blue light emitting layer proximal to the semi-transparent connecting layer, a third carrier injection layer on a side of the third carrier transport layer proximal to the semi-transparent connecting layer, a fourth carrier transport layer on a side of the blue light emitting layer distal to the semi-transparent connecting layer, and a fourth carrier injection layer on a side of the fourth carrier transport layer distal to the semi-transparent connecting layer.

13. The tandem organic electroluminescent apparatus of claim 11, wherein the blue light emitting unit has a thickness of about 70 nm.

14. The tandem organic electroluminescent apparatus of claim 5, wherein the blue light emitting unit has a thickness in a range of about 165 nm to about 215 nm.

15. The tandem organic electroluminescent apparatus of claim 1, wherein the reflective electrode is made of one or a combination of silver and aluminum.

16. The tandem organic electroluminescent apparatus of claim 9, wherein the reflective electrode has a thickness in a range of about 80 nm to about 300 nm.

17. The tandem organic electroluminescent apparatus of claim 16, wherein the reflective electrode has a thickness of about 200 nm.

18. A display apparatus, comprising a tandem organic electroluminescent apparatus of claim 1.

19. A method of fabricating a tandem organic electroluminescent apparatus, comprising:
   forming a reflective electrode on a base substrate;
   forming a first light emitting unit on the reflective electrode;
   forming a semi-transparent connecting layer on a side of the first light emitting unit distal to the reflective electrode;
   forming at least one second light emitting unit on a side of the semi-transparent connecting layer distal to the first light emitting unit; and
   forming a transparent electrode on a side of the at least one second light emitting unit distal to the semi-transparent connecting layer;
   wherein the semi-transparent connecting layer and the reflective electrode form a microcavity.

20. The method of claim 19, wherein the first light emitting unit is a blue light emitting unit, and the second light emitting unit is a yellow light emitting unit.

* * * * *